United States Patent
Bolvardi et al.

(10) Patent No.: US 12,157,939 B2
(45) Date of Patent: Dec. 3, 2024

(54) COATED TOOL WITH COATING COMPRISING BORIDE-CONTAINING DIFFUSION BARRIER LAYER

(71) Applicant: Oerlikon Surface Solutions AG, Pfäffikon, Pfäffikon (CH)

(72) Inventors: Hamid Bolvardi, Selzach (CH); Jürgen Ramm, Maienfeld (CH); Mirjam Arndt, Wetzlar (DE)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 527 days.

(21) Appl. No.: 17/429,576

(22) PCT Filed: Feb. 10, 2020

(86) PCT No.: PCT/EP2020/053345
§ 371 (c)(1),
(2) Date: Aug. 9, 2021

(87) PCT Pub. No.: WO2020/161358
PCT Pub. Date: Aug. 13, 2020

(65) Prior Publication Data
US 2022/0136096 A1 May 5, 2022

Related U.S. Application Data

(60) Provisional application No. 62/802,838, filed on Feb. 8, 2019.

(51) Int. Cl.
*C23C 14/06* (2006.01)
*C23C 14/02* (2006.01)
(Continued)

(52) U.S. Cl.
CPC .......... *C23C 14/067* (2013.01); *C23C 14/024* (2013.01); *C23C 14/025* (2013.01);
(Continued)

(58) Field of Classification Search
CPC ... C23C 14/067; C23C 14/025; C23C 14/027; C23C 14/185
(Continued)

(56) References Cited

U.S. PATENT DOCUMENTS

2011/0220415 A1* 9/2011 Jin .................. C23C 14/024
175/320
2017/0030204 A1* 2/2017 Gorokhovsky ....... C23C 28/345

FOREIGN PATENT DOCUMENTS

CN 108588655 A 9/2018
EP 3211114 A1 8/2017

OTHER PUBLICATIONS

W Tang et al, "A comparison in performance of diamond coated cemented carbide cutting tools with and without a boride interlayer", Surface and Coatings Technology, Apr. 1, 2002, pp. 298-303, vol. 153, No. 2-3.

* cited by examiner

*Primary Examiner* — Katherine A Christy

(57) ABSTRACT

Coated tool comprising a coated surface, the coated surface comprising a substrate having a surface on which a coating is deposited, wherein the substrate is made of a material comprising cobalt, and wherein the coating comprises at least one boron-comprising layer, wherein the at least one boron-comprising layer comprises Al and the boron comprised in this layer is present as boride, thereby the boron-comprising layer is able to form further layers for providing a diffusion barrier layer effect, in particular for stopping diffusion of cobalt from the substrate surface to the coating, when the coated tool or the coated surface is exposed to temperatures in a range between approximately 600 and 1200° C.

16 Claims, 3 Drawing Sheets

Figure 1:
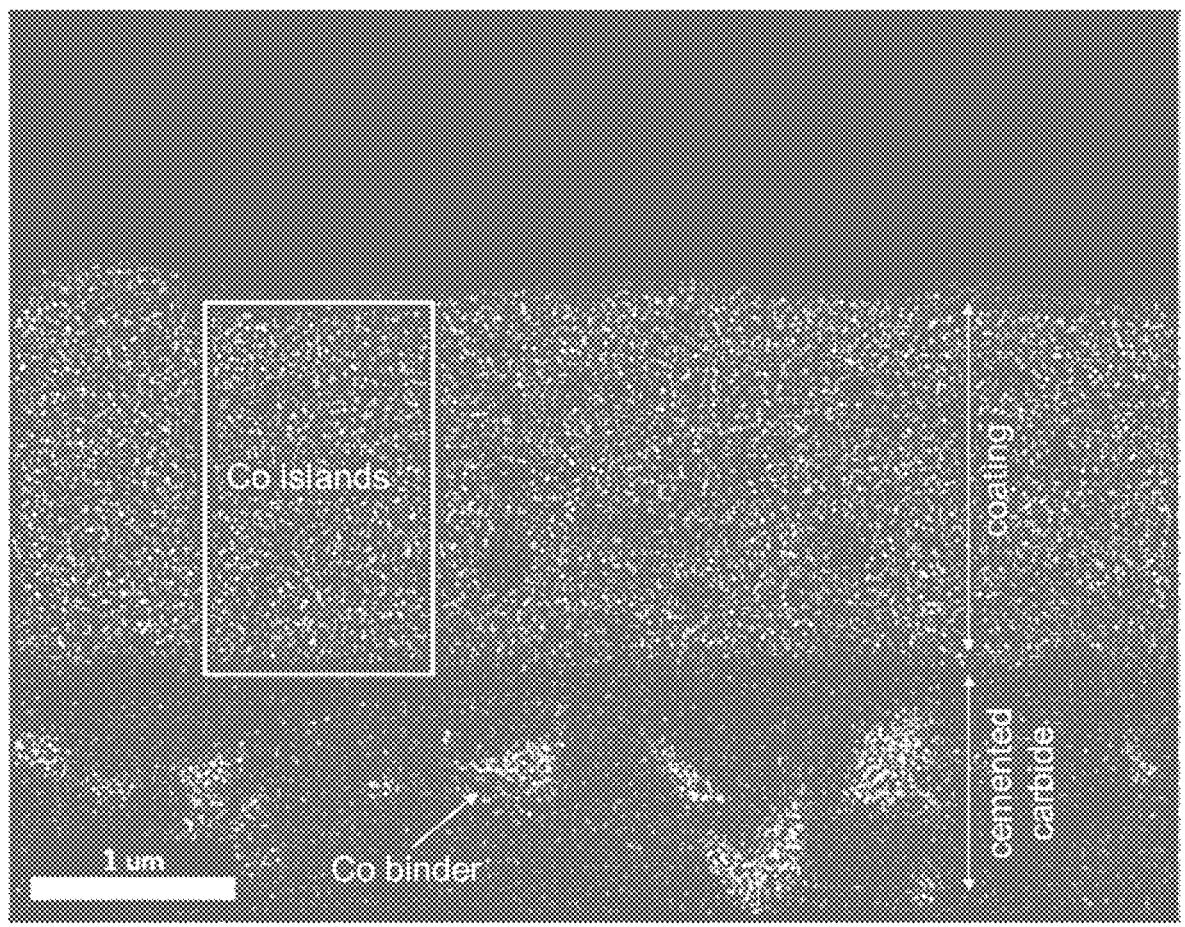

(51) Int. Cl.
*C23C 14/18* (2006.01)
*C23C 14/32* (2006.01)
*C23C 14/34* (2006.01)
*C23C 14/54* (2006.01)
*B26D 1/00* (2006.01)

(52) U.S. Cl.
CPC .......... *C23C 14/027* (2013.01); *C23C 14/185* (2013.01); *C23C 14/325* (2013.01); *C23C 14/3407* (2013.01); *C23C 14/3464* (2013.01); *C23C 14/541* (2013.01); *B26D 1/0006* (2013.01); *B26D 2001/002* (2013.01)

(58) Field of Classification Search
USPC ........................................................ 428/627
See application file for complete search history.

COATED TOOL WITH COATING COMPRISING BORIDE-CONTAINING DIFFUSION BARRIER LAYER

TECHNICAL FIELD

A broad range of industrial processes take place under severe conditions e.g. high temperature. Demanding efficiency improvements scale up this severity drastically. One approach to protect industrial tools in such operational conditions is to separate the tools from the harsh environments with implementation of thin coatings over the tools surface. Among coatings methods physical vapor deposition (PVD) technique has gained immense attention both in academia and industry and has validated immense successes.

Nonetheless, still today high temperatures can affect the coating applied on a tool surface as well as the tool surface covered with the coating (i.e. the substrate surface covered with the coating).

A well-known example is coated cemented carbide cutting tools. During use of tools, especially in case of tools made of or comprising cemented carbide, it can happen that the exposure of the tool surfaces to high temperatures results in out-diffusion of cobalt into the coating. Moreover, already during deposition, if this proceeds at high temperatures and intense plasma treatment, the out-diffusion of cobalt to the substrate surface may occur.

Problem to be Solved by the Present Invention

Since, exposure of the substrate, e.g. the cutting edge of a cutting tool, to high temperature in certain applications, e.g. in cutting Ti-containing material, will be inevitable despite of the use of coatings, there is a need of coatings that can help to avoid damages of the substrate surface in operations involving exposition to high temperatures.

In the context of the present invention the term "high temperatures" is used in particular for referring to temperatures in range between 600 and 1200° C.

OBJECTIVE OF THE PRESENT INVENTION

The main objective of the present invention is to provide a coating that helps to suppress the diffusion of elements from the substrate surface to the coating, when the coated substrate surface is subjected to high temperatures. This problem can occur normally:
1. During formation of the coating on the substrate surface being coated, for example because of high temperatures at the substrate surface caused by ion bombardment during coating deposition, or
2. During use of the coated substrate, for example because of direct exposure of the coated substrate surface to high temperatures (e.g. if the coated substrate is a component to be used in a part of a turbine, in which high temperatures are produced) or indirect exposure of the coated substrate to high temperatures (e.g. if the high temperature results from tribological contact of a coated tool with a workpiece during a machining operation).

DESCRIPTION OF THE PRESENT INVENTION

Figure 3B:
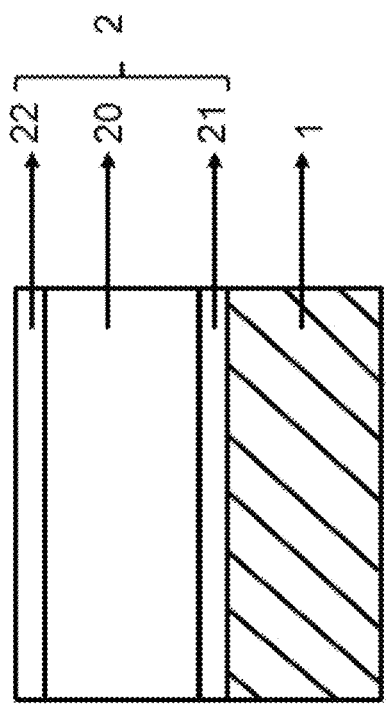
Figure 3A:
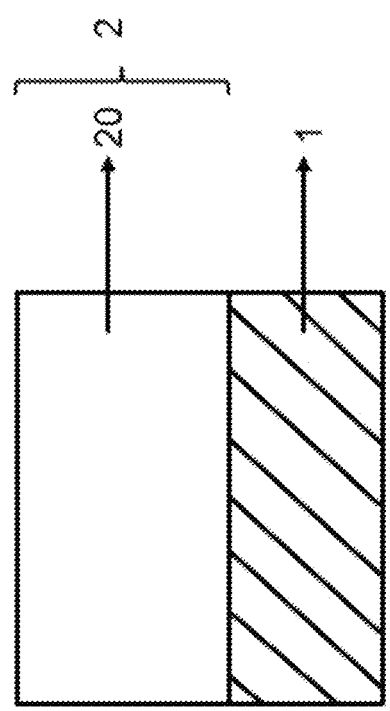

The objective of the present invention is attained by providing a coated substrate comprising a substrate 1 comprising cobalt (Co) and a coating 2 deposited on a surface of the substrate, the coating comprising at least one boron-comprising layer 20, which further comprises aluminum and in which boron is present as boride, wherein the at least one boron-comprising layer 20 is deposited directly on the surface of the Co-comprising substrate 1 (see FIG. 3a).

The inventors observed that the boride comprised in the boron-comprising layer 20 has surprisingly the property of suppressing diffusion of cobalt from the Co-comprising substrate 1 to the coating 2.

This surprisingly effect is especially useful for avoiding damage of substrate and damage of coating in cases in which tools made of Co-comprising materials are used in machining operations, e.g. when cemented carbide tools are used.

The inventors observed that the mechanism of suppressing the diffusion process works in the interface between substrate surface and coating.

The inventors observed a formation of a Co-containing layer 21 (see FIG. 3b) comprising intermetallic phases of Al—Co and B—Co, at least in following two cases:
1. When the coating process was conducted in such a manner that the substrate surface attained high temperatures during coating deposition (for example caused by ion bombardment), and
2. When the coated substrate was exposed to high temperatures during the use.

Thus, it was possible to suppress diffusion of cobalt from a Co-comprising workpiece to the coating, because of the formation of intermetallic phases of Al—Co and B—Co in the interface between the substrate 1 and the coating 2.

In addition, the inventors observed a further beneficial effect, when the inventive coated substrates where exposed to high temperatures in an atmosphere comprising oxygen. This further effect was a formation of an aluminum oxide comprising layer 22 (Al—O comprising layer 22) atop the boron-containing layer 20 (see FIG. 3b). This Al—O comprising layer 22 stop diffusion of oxygen from the atmosphere into the coating, incrementing in this manner chemical stability of the coating at high temperatures also when the coated tool is exposed to atmospheres containing oxygen.

Borides and their superior properties are known. The present invention allows using boride coatings (which are very promising coating materials) in applications involving exposure to high temperatures, inclusive in atmospheres comprising oxygen. It is possible because the inventive coated tool results in higher thermal stability and simultaneously suppress Co diffusion by forming intermetallic compounds at interface of coating and substrate.

For example, in case of using a boron containing layer 20 composed of AlWB2, a layer 21 comprising following kind of intermetallic phases of Al—Co and/or B—Co (e.g. AlCo, Al2Co5, Co2B and/or Co3B) can be formed. These intermetallic phases in the interface between substrate and layer 20, allowing the rest of the coating (e.g. layer 20) remains intact.

Additionally, one major week point of boride coatings is the poor oxidation resistance of them.

Therefore, by having Al-boride coatings, e.g. AlWB2, protective Al—O layer can be formed and suppress the inwards diffusion of O2 from atmosphere to the coating.

In this manner, it was further possible to attain that coating material by itself realizes also in the contact with the workpiece reduced diffusion, especially if the workpiece contains fast diffusing elements like cobalt.

The inventive coating is particularly beneficial for protecting tools having substrates comprising cobalt.

Therefore, according to a preferred embodiment of the present invention, the inventive coating is deposited comprising a boride comprising layer 20 having the property of suppressing diffusion (hereafter in the context of the present invention also called diffusion barrier layer) of cobalt, wherein the diffusion barrier layer is deposited directly on the substrate.

FURTHER DESCRIPTION OF THE INVENTION

The present invention will be explained in more detail with the help of some examples and figures.

Figures caption:

FIG. 1: SEM-EDX elemental mapping showing Co out-diffusion from a substrate (tool of cemented carbide tool comprising Co binder) throughout coating (TiSiN coating comprising Co islands formed as a result of out-diffusion of Co from the cemented carbide substrate) after annealing for 1 h at 1100° C.

Figure 2:
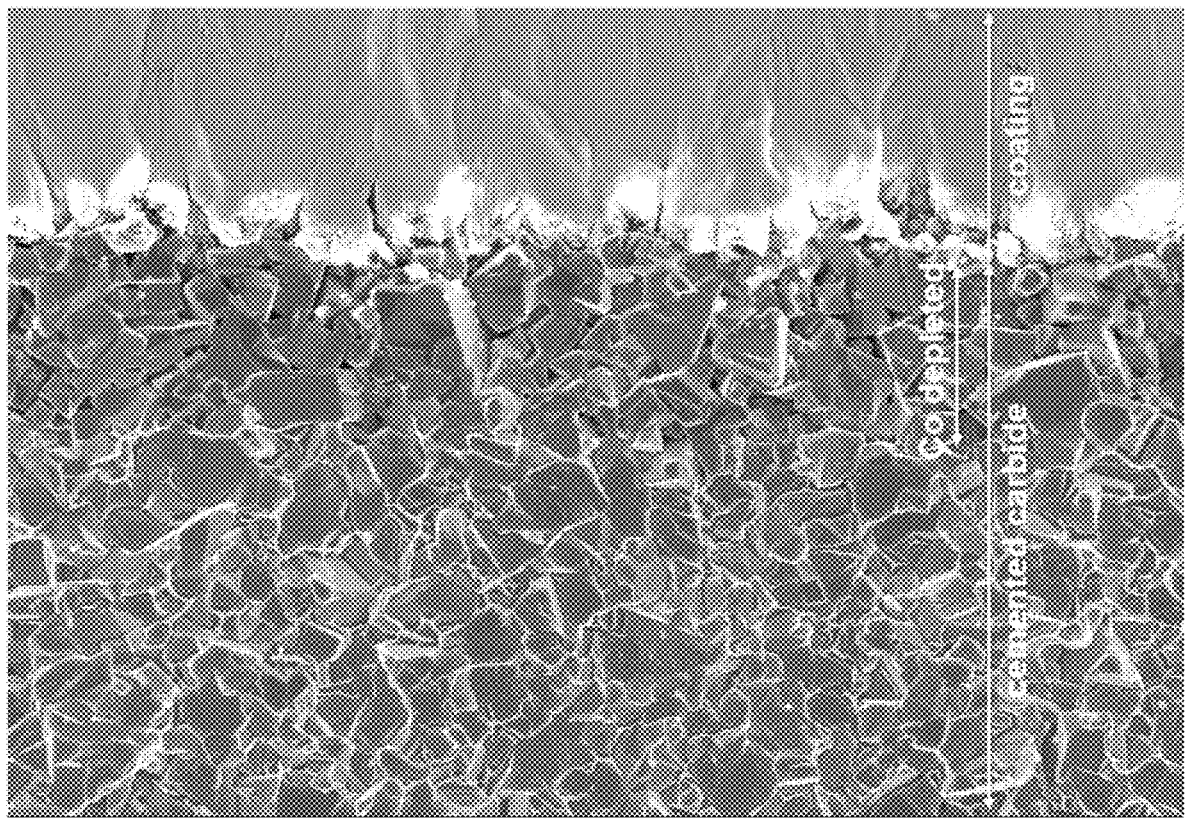

FIG. 2: SEM cross section image of a coated cemented carbide where Co depleted area can be clearly seen.

FIG. 3: Embodiment of an inventive coated substrate before exposure to high temperatures (FIG. 3a) and after exposure to high temperatures (FIG. 3b).

The following description and examples should not be understood as a limitation of the invention.

FIG. 1 presents a SEM/EDX an elemental mapping of cobalt (Co) realized in a cross-section of a coated cemented carbide substrate after annealing at 1100° C. for 60 min. A scanning electron microscope (SEM) was used for making this analysis. The elemental mapping has been done utilizing the Energy-dispersive X-ray spectroscopy (EDX) detector of the SEM. Co binder in the cemented carbide substrate (in this case a cutting tool) as well as Co islands distributed within the TiSiN coating can be observed. The Co islands in the TiSiN coating were not present before annealing. Therefore, the inventors conclude that the Co island in the TiSiN coating were formed as a result of diffusion of Co throughout the coating during annealing.

The depicted out-diffusion in this annealing experiment illustrates the diffusion processes which may proceed during deposition as well as during utilization of the coated substrate as explained above. The diffusion of Co alters the chemical composition of the coatings and its properties thereof. As a result, Co out-diffusion can lead to a weak coating-tool interface and influencing coating properties resulting in a reduction of lifetime of the coated tool.

FIG. 2. presents an example of such an interface in a SEM cross section image. The picture shows the void formation in the interface between the substrate surface and the coating which is initiated by the outdiffusion of Co. In addition an accumulation of Co is seen in the first section of the coating. A weakening of the mechanical properties is therefore obvious.

As mentioned above, diffusion processes may occur or be initiated during the deposition process and during operation of the coated substrate. During deposition, prevalent substrate temperatures in PVD processes are between 300° C. and 600° C., i.e. below the temperature range of 600° C. and 1200° C. which is defined as diffusion relevant. However, the deposition process is characterized not only by the condensation of neutral elements at the surface but also by the simultaneously bombardment with energetic ions. This will result in much higher "temperatures" in the uppermost surface of the substrate and increases the mobility of Co atoms for diffusion. In the other case, during operation of the coated substrate, the surface of the coated tool in contact with the work piece (e.g. the cutting edge of a cutting tool) can be become very hot, and my exceed 1000° C., e.g. for machining of Ti-Alloys. Under these conditions, the diffusion of Co is also initiated.

A first objective of the present invention is to provide a coating which suppresses the diffusion of Co at high temperatures from the substrate material into the coating.

Another objective of the present invention is to provide a coating with superior mechanical properties with respect to hardness and Youngs modulus at room temperature as well as at high temperatures.

Binary and ternary Al—B compounds show very attractive properties such as high hardness in excess of 50 GPa which make them promising candidates for wear resistant coating to protect cutting tools and components in harsh environment.

The composition of of Al—B-based coatings by PVD is more or less determined by the composition of the target utilized for sputtering or cathodic arc evaporation.

According to a preferred embodiment of the present invention the coating or at least part of the coating is produced by using PVD (physical vapor deposition) sputtering techniques, preferably non-reactive PVD sputtering techniques, i.e. only a non-reactive gas, e.g. argon is used as process gas.

According to a further preferred embodiment of the present invention the coating (for producing the inventive coated tool) the coating or at least part of the coating is deposited by using PVD (physical vapor deposition) cathodic arc evaporation techniques, preferably non-reactive PVD cathodic arc evaporation techniques, i.e. no process gas or only a non-reactive gas, e.g. argon is used as process gas.

Depending on the parameters in these processes (target composition and fabrication, evaporation process, reactive and noble gas background atmosphere, substrate bias etc.), the Al—B-based coatings may contain, in addition to the elemental constituents, different Al—B phases according to the corresponding phase diagram.

An important contribution of the present invention is furthermore the prevention of oxygen diffusion towards the substrate/coating interface and towards the substrate which initiates the outward diffusion of Co through the coating. Because the Al—B-based coatings inherently contain Al which reacts with oxygen, it forms at the surface of the coating as well as in the regions where oxygen can diffuse to a Al—O which acts as diffusion barrier.

On the other hand, Co diffusion is reduced also in regions where this mechanism is not present due to the lack of oxygen. Here the high temperature initiates the formation of intermetallic phases of Al—Co and B—Co which reduce the diffusion of elemental Co.

The present invention relates concretely to a coating system comprising at least one diffusion barrier layer, wherein the at least one diffusion transition layer is:
 a layer of $AlB_2$ or a layer comprising $AlB_2$, or
 a layer of $AlWB_2$ or a layer comprising $AlWB_2$, or
 a layer of $AlB_2$ and $AlWB_2$ or a layer comprising $AlB_2$ and $AlWB_2$, or
 a layer of AlN and $AlB_2$ or a layer comprising AlN and $AlB_2$, or
 a layer of AlN and $AlWB_2$ or a layer comprising AlN and $AlWB_2$ or, or
 a layer of a transition metal boride (TM boride) or a layer comprising a TM boride, wherein TM is one or more transition metals selected from the following group: 3d, 4d and 5d elements, this layer comprising furthermore Al.

In the transition region between the cobalt containing substrate and the boride containing layer, a gradient layer containing Al and W can be added for improved adhesion and suppressing cobalt out-diffusion to the substrate surface during the deposition process.

The inventive coating can be deposited exhibiting a monolithic or layered coating architecture comprising one or more of the above described diffusion barrier layers.

The inventive coating can be used for coating cemented carbide tools in a range of applications where the coated tool is exposed to high temperatures, such as cutting of Ti—Al compounds.

The inventive coating can be used for coating cemented carbide tools in a range of applications where the coated tool is exposed to high temperatures, such applications preferably are cutting of Ni-based, Co-based or Ni—Co-based superalloys.

The presence of the Al in these layers is preferred because Al can be important for attaining suppression of Co out-diffusion into the coating. The presence of borides compounds in these layers is preferred because boride compounds can be decisive for providing superior properties such as superior hardness, in particular a hardness of over 35 GPa, which is a very important property in different operations, e.g. in different cutting tool applications.

Prevented Co out-diffusion into the coating ensures the unique properties of these inventive coatings to remain intact during applications at high temperatures.

The binary and ternary borides in the context of the present invention can be synthesized for example by non-reactive physical vapor deposition (PVD) sputtering technique where merely Ar is used as the process gas. Binary boride targets are sputtered in an Ar atmosphere for synthesis of binary borides and simultaneous sputter of two binary boride targets, e.g. $WB_2$ and $AlB_2$, synthesizes the ternary boride over a broad range of chemical compositions, in this case $WAlB_2$. In such a combinatorial synthesis of the later one, chemical composition of the synthesized coating can be tuned based on the power applied to the each binary boride target and the change in sputtering rate thereof. Required process gas pressure range for attaining a stable process is from 0.3 to 0.9 Pa. Adjusting process gas pressure in the above-mentioned range allows ensuring process stability. Substrate temperature ranges from 400 to 600° C. ensure the required mobility when low bias voltage values from floating to 50 V are used. In this setting, favored crystal structures can be obtained and at the same time the residual stress level of the boride coatings does not produce coating delamination.

For deposition of an intermediate/gradient layer between the substrate surface and the borides, preferably Al—W targets with more than 20 at. % W are utilized.

The above given example describes the deposition by sputtering. Of course, it is also possible to deposit Al—B-based coating by cathodic arc evaporation. In this process, targets Al—B or Al—B—W containing targets are utilized as cathodes.

The most important aspects of the invention can be summarized as following:
Coated tools comprising a coated surface, the coated surface comprising a substrate surface being part of the coated tool and a coating deposited on said substrate surface, wherein the substrate surface is made of a material comprising cobalt and/or nickel, and wherein the coating comprises at least one boride comprising layer, wherein said at least one boride comprising layer is made of a boride or is made of a boride comprising material, and wherein said at least one boride comprising layer is a diffusion barrier layer that stops diffusion of cobalt and/or nickel from the substrate surface to the coating, when the coated tool or the coated surface is exposed to temperatures in a range between approximately 600 and 1200° C.

The above-mentioned diffusion barrier layer is made preferably comprising:
$AlB_2$ or
$AlWB_2$ or
$AlB_2$ and $AlWB_2$ or
a TM boride, where TM is one or more transition metals selected from the following group 3d, 4d and 5d elements, this layer comprising furthermore Al.

In a particularly preferred embodiment of the present invention, the diffusion barrier layer mentioned above is an AlWB2 layer.

In a further preferred embodiment of the present invention, the substrate surface is made of cemented carbide or comprises cemented carbide or is made or any other material comprising cobalt.

In one more preferred embodiment of the present invention the substrate surface is made of a nickel alloy or a nickel comprising material carbide or is made or any other material comprising nickel.

In one more preferred embodiment of the present invention the coating comprises in addition to the diffusion barrier layer, a layer comprising Al and W but that is preferably not a boride layer.

In one more preferred embodiment of the present invention the above-mentioned layer that comprises Al and W but that is preferably not a boride layer, is a metallic layer Al—W layer deposited as intermediate layer (or interlayer) between the substrate and the diffusion barrier layer.

In one more preferred embodiment of the present invention the above-mentioned intermediate layer is a gradient layer.

The present invention is furthermore related to the use of a coated tool according to any of the above-mentioned embodiments or combinations thereof, wherein the coated tool or the coated surface is exposed to temperatures in a range between approximately 600 and 1200° C.

The present invention is furthermore related to the use of a coated tool according to any of the above-mentioned embodiments or combinations thereof, wherein the substrate of the coated tool is cemented carbide and above the diffusion barrier layer a diamond layer is deposited. In such a case, it is not necessary that the cemented carbide substrate undergoes a pretreatment for removing cobalt before deposition of the diamond layer.

The present invention is furthermore related to a method for coating a coated tool according to any of the previous claims 1 to 7, characterized in that the coating is sputtered using PVD, in particular non-reactive PVS (physical vapor deposition).

In one more preferred embodiment of the present invention in the above-mentioned method Ar is used as process gas.

In one more preferred embodiment of the present invention in the above-mentioned method at least one binary boride target is sputtered, in particular for synthesis of binary borides and preferably for simultaneously sputtering of two binary boride targets, for example $WB_2$ and $AlB_2$.

In one more preferred embodiment of the present invention in the above-mentioned method a pressure range from 0.3 to 0.9 Pa is used during sputtering.

In one more preferred embodiment of the present invention in the above-mentioned method a temperature range from 400 to 600° C. is used during sputtering.

In one more preferred embodiment of the present invention in the above-mentioned method a bias value of less than 50 V is used during sputtering.

In one more preferred embodiment of the present invention in the above-mentioned method for deposition of the intermediate layer Al—W a target with more than 20 at % W is utilized.

All the above-mentioned embodiments of coated tools according to the present invention could be used for machining of super alloy materials.

The diffusion boride layers in the context of the present invention could be used as diffusion barrier layers for stopping diffusion of other elements different from cobalt and nickel.

The invention claimed is:

1. A coated tool comprising a coated surface, the coated surface comprising a substrate having a surface on which a coating is deposited, wherein the substrate is made of a material comprising cobalt, and wherein the coating comprises at least one boron-comprising layer, wherein the at least one boron-comprising layer comprises $AlWB_2$, thereby the boron-comprising layer forms further layers that provide a diffusion barrier layer effect and stop diffusion of cobalt from the substrate surface to the coating when the coated tool or the coated surface is exposed to temperatures in a range between approximately 600 and 1200° C., wherein the coating comprises a first further layer formed between the substrate and the at least one boron-containing layer, said first further layer comprising intermetallic phases of Al-Co and intermetallic phases of B-Co.

2. The coated tool according to claim 1, wherein the boron-comprising layer further comprises:
    $AlB_2$ or
    a TM boride, where TM is one or more transition metals selected from the following group 3d, 4d and 5d elements.

3. The coated tool according to claim 1, wherein the coating comprises a second further layer formed atop the at least one boron-containing layer, said second further layer comprising Al-O.

4. The coated tool according to claim 1, wherein the substrate surface is made of cemented carbide or comprises cemented carbide.

5. The coated tool according to claim 1, wherein the coating comprises in addition to the diffusion barrier layer, a layer comprising Al and W but that is not a boride layer.

6. The coated tool according to claim 5, wherein the layer comprising Al and W but that is not a boride layer, is a metallic layer Al-W layer deposited as an intermediate layer between the substrate and the diffusion barrier layer.

7. The coated tool according to claim 6, wherein the intermediate layer is a gradient layer.

8. The coated tool according to claim 1, wherein the substrate of the coated tool is cemented carbide and a diamond layer is deposited above the diffusion barrier layer.

9. A method for coating a coated tool according to claim 1, wherein the method comprises following steps:
    1) depositing the at least one boron-comprising layer directly on the surface of the Co-comprising substrate; and
    2) forming the first further layer comprising intermetallic phases of Al-Co and B-Co by subjecting the substrate surface to high temperatures during coating deposition or by exposing the coated surface to high temperatures, wherein high temperatures are temperatures in the range between 600° C. and 1200° C.

10. The method according to claim 9, comprising using argon as process gas.

11. The method according to claim 10, comprising using PVD sputtering techniques, wherein at least one binary boride target is sputtered for synthesis of binary borides.

12. The method for coating a coated tool according to claim 9, wherein the coating or at least part of the coating is produced by using non-reactive PVD sputtering techniques, or by using non-reactive PVD cathodic arc evaporation techniques.

13. The method according to claim 12, comprising using a pressure range from 0.3 to 0.9 Pa during sputtering.

14. The method according to claim 12, comprising using a substrate temperature in a range from 400 to 600° C. during sputtering.

15. The method according to claim 12, comprising using a bias value from floating to 50 V during sputtering.

16. The method according to claim 12, wherein for deposition of the intermediate layer Al-W a target with more than 20 at % W is utilized.

* * * * *